US010461461B2

(12) United States Patent
Shimtosu et al.

(10) Patent No.: US 10,461,461 B2
(45) Date of Patent: Oct. 29, 2019

(54) MULTI POLE CONNECTOR FOR SECURELY COUPLING TERMINALS AND TARGET TERMINALS

(71) Applicant: Molex, LLC, Lisle, IL (US)

(72) Inventors: Akihiro Shimtosu, Ebina (JP); Kota Kamezaki, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/006,077

(22) Filed: Jun. 12, 2018

(65) Prior Publication Data

US 2018/0358733 A1 Dec. 13, 2018

(30) Foreign Application Priority Data

Jun. 12, 2017 (JP) ................................ 2017-114976

(51) Int. Cl.
*H01R 12/00* (2006.01)
*H05K 1/00* (2006.01)
(Continued)

(52) U.S. Cl.
CPC ....... *H01R 13/514* (2013.01); *H01R 12/7082* (2013.01); *H01R 12/714* (2013.01); *H01R 13/2435* (2013.01); *H01R 13/405* (2013.01)

(58) Field of Classification Search
CPC . H01R 13/2435; H01R 12/7082; H01R 9/096
(Continued)

(56) References Cited

U.S. PATENT DOCUMENTS 4,806,104 A 2/1989 Cabourne
6,926,536 B2 * 8/2005 Ochiai .............. H01R 13/2492 439/591
(Continued)

FOREIGN PATENT DOCUMENTS

CN 2264997 Y 10/1997
CN 1465120 A 12/2003
(Continued)

OTHER PUBLICATIONS

Non-Final Office Action Received for U.S. Appl. No. 16/414,790, dated Aug. 14, 2019, 9 pages.

*Primary Examiner* — Hae Moon Hyeon
*Assistant Examiner* — Thang H Nguyen
(74) *Attorney, Agent, or Firm* — Molex, LLC

(57) ABSTRACT

A plurality of module housings extending in a lateral direction and arranged in a longitudinal direction orthogonal to the lateral direction, and terminals attached to the module housings are included. The terminals each include a pair of contact parts respectively projecting upward above an upper surface and downward below a lower surface of each of the module housings, and a first direction conversion mechanism configured to convert at least some of displacement and a force received by the pair of contact parts in an upper-lower direction orthogonal to the lateral direction and the longitudinal direction into displacement and a force in the longitudinal direction. The module housings each include a second direction conversion mechanism configured to convert at least some of displacement and a force received from each of the terminals in the longitudinal direction into displacement and a force in the upper-lower direction.

10 Claims, 14 Drawing Sheets

(51) Int. Cl.
*H01R 13/514* (2006.01)
*H01R 12/70* (2011.01)
*H01R 13/24* (2006.01)
*H01R 13/405* (2006.01)
*H01R 12/71* (2011.01)

(58) Field of Classification Search
USPC .................................................... 439/66, 862
See application file for complete search history.

(56) References Cited

U.S. PATENT DOCUMENTS 7,435,100 B2 * 10/2008 Chang ................ H01R 13/2435
439/66
7,568,917 B1 * 8/2009 Malstrom .......... H01R 13/2435
439/66
7,625,217 B1 * 12/2009 Liao ..................... H01R 12/714
439/66
8,858,238 B2 * 10/2014 Luo .................... H01R 12/7082
439/66
9,172,161 B2 * 10/2015 Walden ................ H01R 12/714
9,437,948 B2 9/2016 Ju
10,027,061 B2 * 7/2018 Avery ................ H01R 13/2442
10,103,470 B2 10/2018 Ju
2012/0220169 A1 * 8/2012 Uozumi ............... H01R 12/714
439/660
2014/0162471 A1 * 6/2014 Hwang .............. H01R 12/7082
439/65
2014/0162472 A1 * 6/2014 Walden ................ H01R 12/714
439/66
2014/0329408 A1 * 11/2014 Chang ................ H01R 13/6585
439/607.01
2016/0036148 A1 * 2/2016 Koguchi .............. H01R 12/716
439/66

FOREIGN PATENT DOCUMENTS

EP 0903811 B1 1/2008
JP 3062938 B2 7/2000
JP 2012-174617 A 9/2012
JP 2016-503946 A 2/2016
WO WO 2005-015692 A1 2/2005

* cited by examiner

FIG. 5A
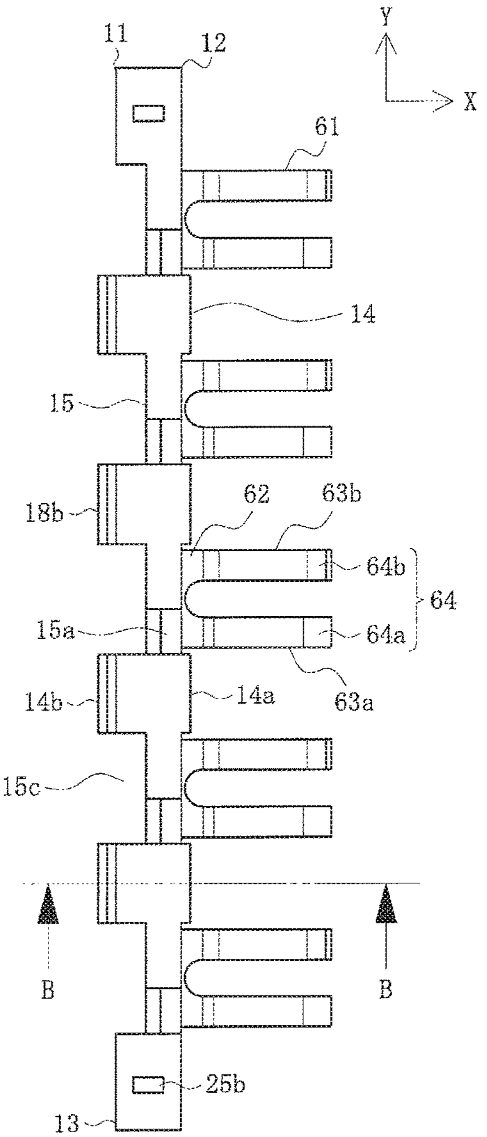
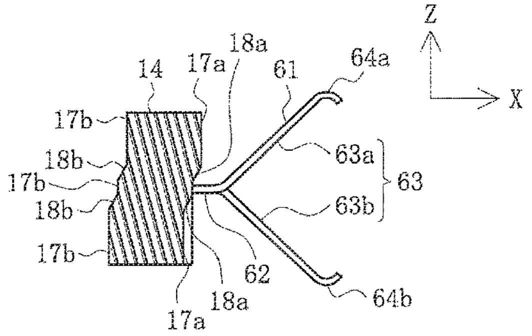
FIG. 5B

MULTI POLE CONNECTOR FOR SECURELY COUPLING TERMINALS AND TARGET TERMINALS

RELATED APPLICATIONS

This application claims priority to Japanese Application No. 2017-114976, filed Jun. 12, 2017, which is incorporated herein by reference in its entirety.

TECHNICAL FIELD

The present disclosure relates to a connector.

BACKGROUND ART

Multi pole connectors including pin grid array connectors having multiple terminals have been conventionally used to couple a semiconductor device to a circuit board and to couple substrates to each other (e.g., see Patent Document 1).

FIG. 14 is a cross-sectional view of a terminal attaching part of a conventional connector.

In the drawing, the numeral 811 represents a housing of the connector. The housing is a plate member made of an insulation material, such as resin. The housing is formed with a plurality of through holes 813. Inside the through holes 813, metallic contact members 861 are respectively accommodated one by one. Tips of each of the contact members 861 project from upper and lower surfaces of the housing 811, and come into contact with contact pads respectively formed on substrates (not shown) arranged above and below the housing 811. Contacts on the substrates respectively arranged above and below the housing 811 are thus allowed to conduct to each other.

The contact members 861 are each integrally formed with a retaining member 841 made of an insulation material, such as resin, through a molding method, such as over molding. The retaining member 841 is formed with a recess 842. The recess 842 engages with a projection 814 formed on an inner wall of each of the through holes 813. As a result, the contact members 861 are respectively restricted from moving in an upper-lower direction inside the through holes 813.

Patent Document 1: Japanese Patent Publication No. 2016-503946

SUMMARY

In the conventional multi pole connector, the contact members 861 are respectively prevented from moving relative to the housing 811. When the contact members 861 come into contact with the contact pads of the substrates arranged above and below the housing 811, and accordingly deform, the contact members 861 push the housing 811. As a result, the housing 811 may deform. When the housing 811 deforms, gaps may occur between the contact pads of the substrates arranged above and below the housing 811 and the tips of the contact members 861 held by the housing 811. The gaps cause the tips of the contact members 861 to disengage from the contact pads.

In view of the above described problems in the conventional connectors, the present invention has an object to provide a highly reliable connector capable of securely coupling terminals and target terminals without allowing displacement and a force due to the terminals to accumulate and increase.

To achieve the above described object, a connector includes a plurality of module housings extending in a lateral direction and arranged in a longitudinal direction orthogonal to the lateral direction, and terminals attached to the module housings. The terminals each include a pair of contact parts respectively projecting upward above an upper surface and downward below a lower surface of each of the module housings, and a first direction conversion mechanism configured to convert at least some of displacement and a force received by the pair of contact parts in an upper-lower direction orthogonal to the lateral direction and the longitudinal direction into displacement and a force in the longitudinal direction. The module housings each include a second direction conversion mechanism configured to convert at least some of displacement and a force received from each of the terminals in the longitudinal direction into displacement and a force in the upper-lower direction.

In another connector, further, the terminals each include a main body held by each of the module housings, and a pair of contact arms respectively extending upward and downward from the main body. The contact parts are respectively formed adjacent to tips of the contact arms. The contact parts are respectively positioned in front of the main body in the longitudinal direction. The first direction conversion mechanism includes the main body, the pair of contact arms, and the pair of contact parts.

In still another connector, further, the module housings each include abutting blocks. The abutting blocks each have a front face facing forward in the longitudinal direction and a rear face facing rearward in the longitudinal direction. The front face and the rear face respectively have front inclined faces and rear inclined faces respectively inclined with respect to the upper-lower direction. The rear inclined faces respectively abut the front inclined faces of each of the abutting blocks of another adjacent one of the module housings. The other adjacent one of the module housings lies behind in the longitudinal direction. The second direction conversion mechanism includes each of the abutting blocks.

In still another connector, further, the front face and the rear face respectively have front vertical faces and rear vertical faces extending in the upper-lower direction. Before the second direction conversion mechanism converts at least some of displacement and a force in the longitudinal direction into displacement and a force in the upper-lower direction, the rear vertical faces are respectively away from the front vertical faces of each of the abutting blocks of the other adjacent one of the module housings. The other adjacent one of the module housings lies behind in the longitudinal direction.

In still another connector, further, the plurality of front vertical faces and the plurality of rear vertical faces are arranged in the upper-lower direction. Each of the front inclined faces and each of the rear inclined faces are respectively arranged between the front vertical faces adjacent to each other in the upper-lower direction and between the rear vertical faces adjacent to each other in the upper-lower direction.

In still another connector, further, the module housings each have terminal holding walls each configured to hold the main body. The terminal holding walls each have groove recesses allowing one of or two or more of the pairs of contact arms of the terminals of other adjacent ones of the module housings to pass through. The other adjacent ones of the module housings lie behind in the longitudinal direction.

In still another connector, further, the plurality of terminal holding walls are arranged in the lateral direction. Each of the abutting blocks is arranged between the terminal holding walls adjacent to each other in the lateral direction.

In still another connector, further, coupling members are included. The coupling members each include a main body extending in the longitudinal direction, and a plurality of projecting pieces projecting from the main body to form comb teeth. The module housings each include coupling blocks each formed with a positioning hole configured to accommodate one of the projecting pieces. A size, in the longitudinal direction, of the positioning hole is greater than a size, in the longitudinal direction, of each of the projecting pieces.

In still another connector, further, a pair of housing parts are included. The pair of housing parts are configured to be coupled to the coupling members. The plurality of module housings are arranged between the housing parts.

With the present disclosure, terminals and target terminals are securely coupled with improved reliability.

BRIEF DESCRIPTION OF THE DRAWINGS

FIG. 2A is a top view and FIG. 2B is a side view.

FIG. 4A is a perspective view when viewed from rear and FIG. 4B is a perspective view when viewed from front.

FIGS. 5A and 5B are two-side views of the module according to the first embodiment, where FIG. 5A is a top view and FIG. 5B is a cross-sectional view taken along line B-B indicated by arrows in FIG. 5A.

FIG. 9A is a view before fully coupled and FIG. 9B is a view after fully coupled.

DETAILED DESCRIPTION OF THE PREFERRED EMBODIMENTS

Embodiments will be described in detail below with reference to the drawings.

Figure 1:
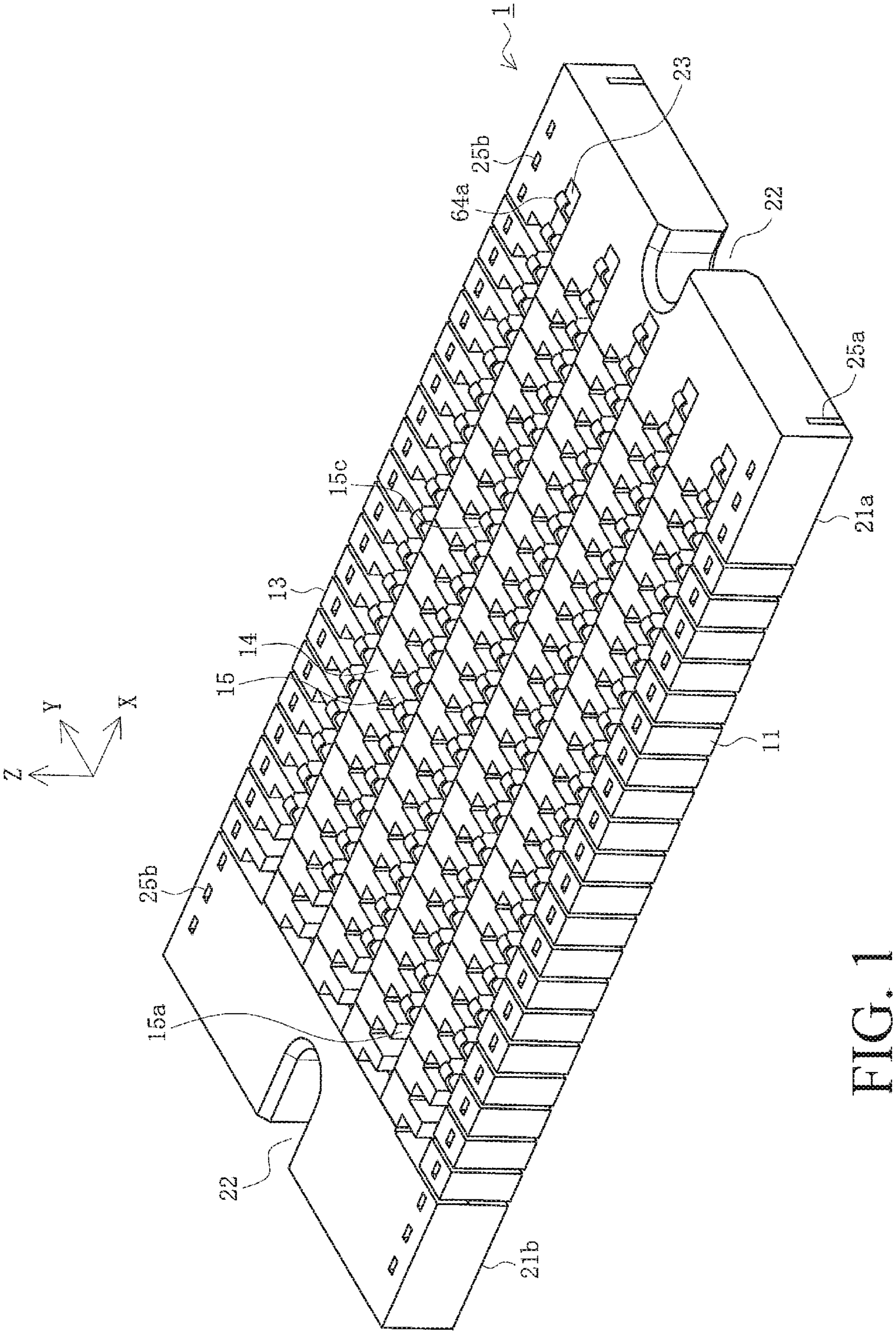
FIG. 1 is a perspective view of a connector according to a first embodiment.
Figure 2A:
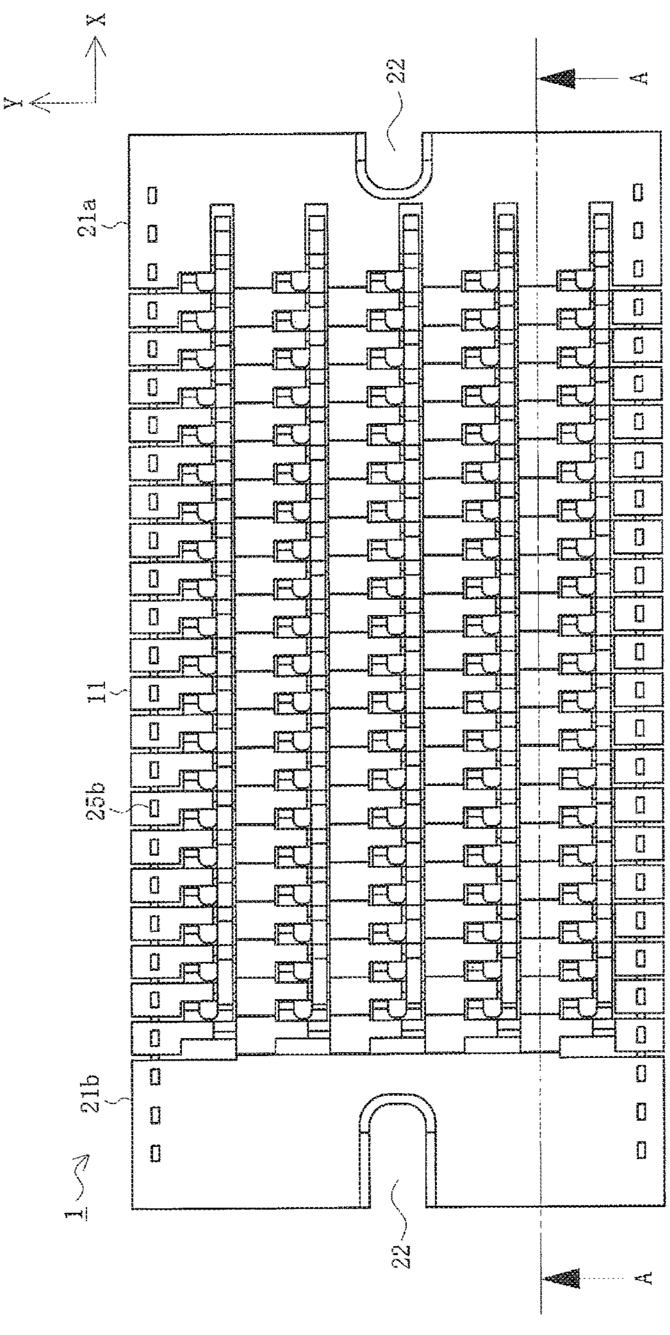
FIGS. 2A and 2B are two-side views of the connector according to the first embodiment, where
Figure 2B:
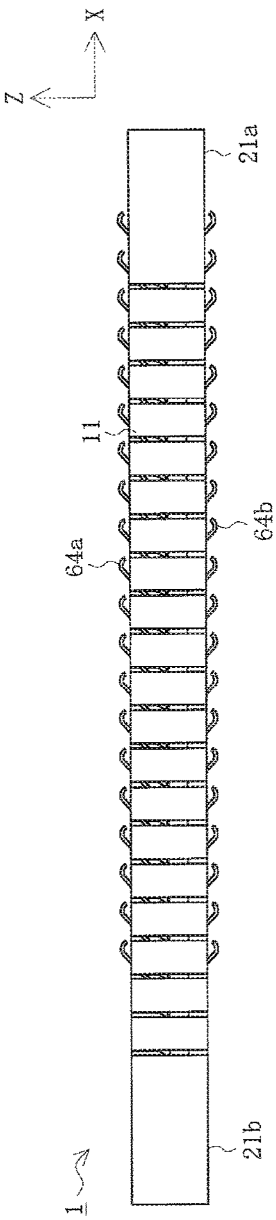
Figure 3:
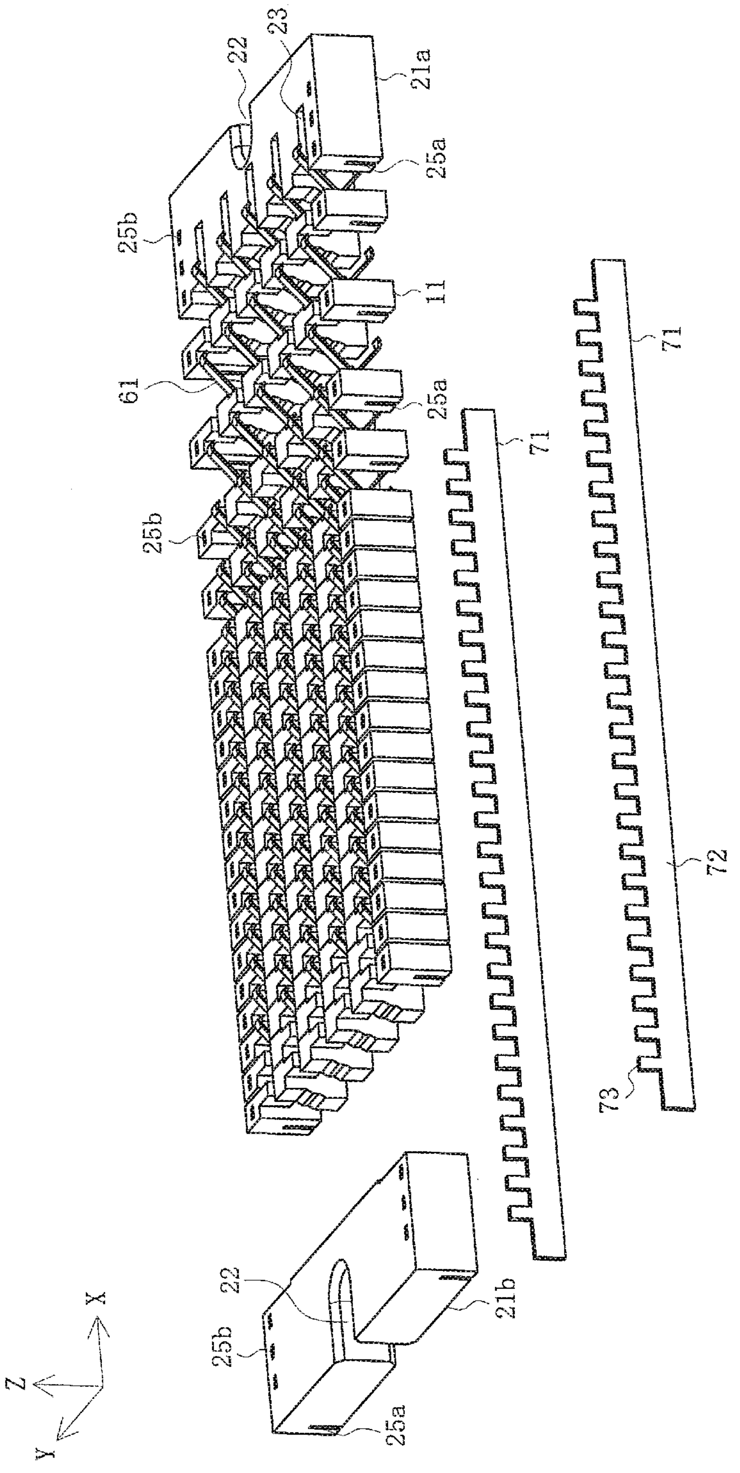
FIG. 3 is an exploded view of the connector according to the first embodiment.
Figure 4A:
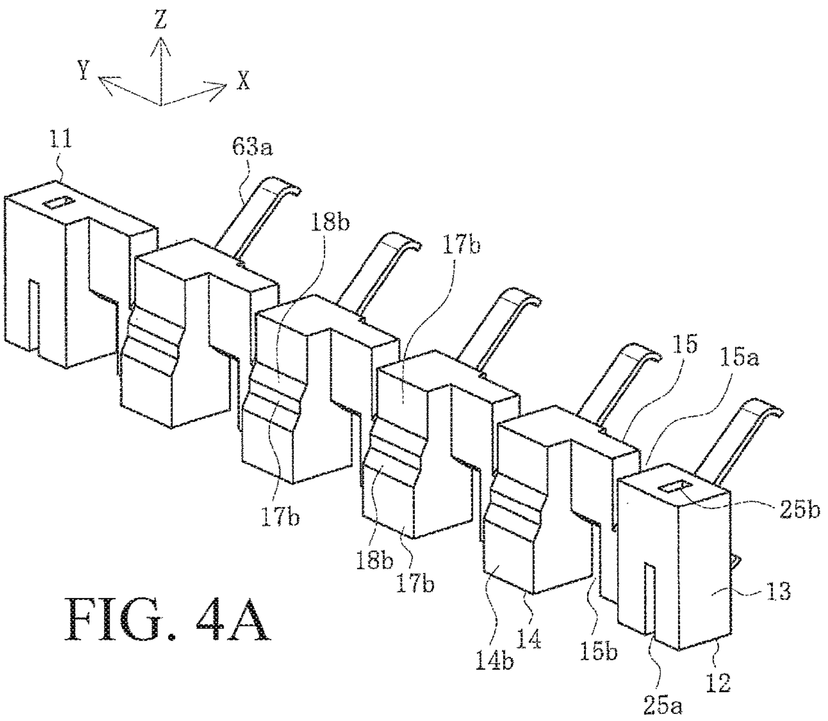
FIGS. 4A and 4B are perspective views of a module according to the first embodiment, where
Figure 4B:
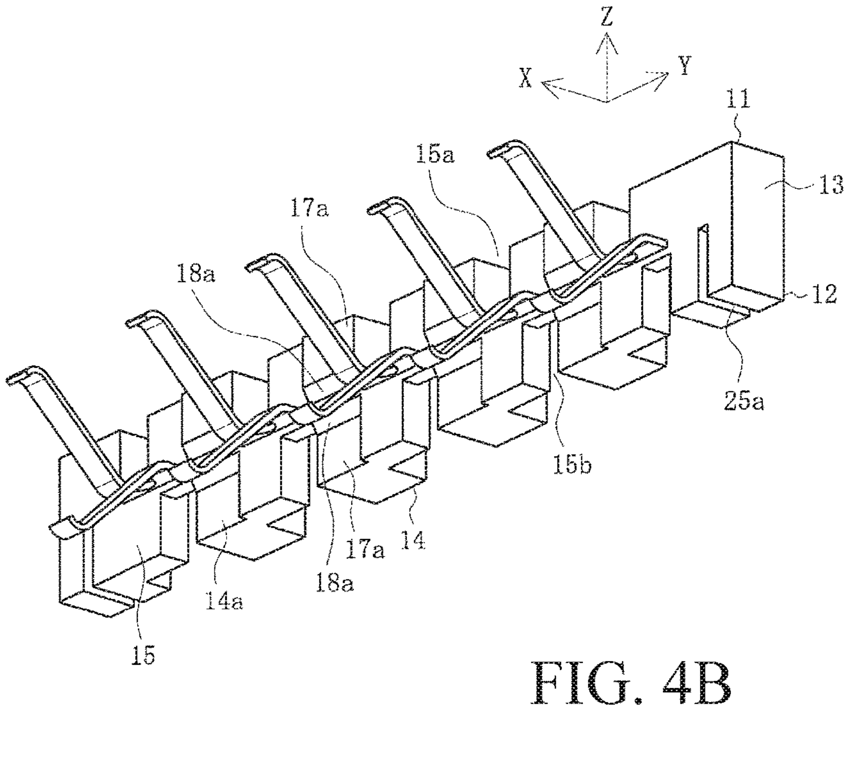

FIG. 1 is a perspective view of a connector according to a first embodiment. FIGS. 2A and 2B are two-side views of the connector according to the first embodiment. FIG. 3 is an exploded view of the connector according to the first embodiment. FIGS. 4A and 4B are perspective views of a module according to the first embodiment. FIGS. 5A and 5B are two-side views of the module according to the first embodiment. FIG. 2A is a top view, while FIG. 2B is a side view. FIG. 4A is a perspective view when viewed from rear, while FIG. 4B is a perspective view when viewed from front. FIG. 5A is a top view, while FIG. 5B is a cross-sectional view taken along line B-B indicated by arrows in FIG. 5A.

In the drawings, the numeral 1 represents a connector, i.e., multi pole connector, according to the present embodiment. The connector is a thick, rectangular flat member. The connector electrically couples a first substrate 101 and a second substrate 201. The first substrate 101 and the second substrate 201 will be described later as a pair of circuit boards. The first substrate 101 and the second substrate 201 may be, but not limited to, printed circuit boards, flexible flat cables, and flexible printed circuit boards used in electronic devices, for example.

Note, in the present embodiment, expressions indicating the directions such as up, down, left, right, front, and back that are used to describe the configuration and operation of each part included in the connector 1 and other members are relative and not absolute, and they are suitable when each part included in the connector 1 and other members is in the position illustrated by the drawings; however, when the position of each part included in the connector 1 and other members is changed, then they should be interpreted with changes corresponding to the changes of the positions.

The connector 1 includes a plurality of modules 11 arranged adjacent to each other in a longitudinal direction (X-axis direction), a front housing part 21*a* and a rear housing part 21*b* respectively serving as connector housings, a pair of coupling members 71 coupling the modules 11, the front housing part 21*a*, and the rear housing part 21*b*. A number of the modules 11 can be determined as required. The number of the modules 11 is designated to 20 in the example to be described. The front housing part 21*a* and the rear housing part 21*b* respectively are thick, rectangular flat members integrally formed and made of an insulation material, such as synthetic resin. The coupling members 71 are integrally-formed, elongated members made of a material having relatively higher strength, such as metal. The coupling members 71 each include a main body 72 having an elongated thin plate shape extending in the X-axis direction, and a plurality of projecting pieces 73 projecting upward (positive direction along the Z axis) from an upper end side of the main body 72 to form comb teeth.

Each of the modules 11 includes a module housing 12 and a plurality of terminals 61. The module housing 12 is elongated and integrally formed, extends in a lateral direction (Y-axis direction), and is made of an insulation material, such as synthetic resin. The plurality of terminals 61 is integrally formed, is made of metal having conductivity and a spring feature, and is attached to the module housing 12. A number of the terminals 61 can be determined as required. The number of the terminals 61 is designated to five in the example to be described. It is preferable that the module housing 12 and the terminals 61 be integrated through a molding method, such as insert molding or over molding.

The module housing 12 has a pair of coupling blocks 13 arranged at both ends in the lateral direction (Y-axis direction), a plurality of (four in the example illustrated in the drawings) abutting blocks 14 configured to abut the other adjacent module housings 12, and terminal holding walls 15 each arranged between the abutting blocks 14 adjacent to each other or one of the abutting blocks 14 and one of the coupling blocks 13. The terminal holding walls 15 are thin members. A thickness of each of the terminal holding walls 15 is thinner (smaller in size in the X-axis direction) than a thickness of each of the coupling blocks 13, as well as is thinner than a thickness of each of the abutting blocks 14. On a back (negative direction along the X axis) of each of the terminal holding walls 15, a terminal accommodation recess 15*c* is formed.

Each of the terminals 61 has a flat main body 62 extending in the X-axis direction, and a pair of contact arms 63 extending forward (positive direction along the X axis) from the main body 62. As illustrated in FIG. 5A, each of the terminals 61 is a member having an approximately fork shape when viewed in plan (X-Y plane). One (negative side one along the Y axis, in the example illustrated in the drawings) of the pair of contact arms 63 is an upper arm 63*a* extending diagonally upward (positive direction along the X axis and positive direction along the Z axis). Another one (positive side one along the Y axis, in the example illustrated in the drawings) is a lower arm 63*b* extending diagonally downward (positive direction along the X axis and negative direction along the Z axis). As illustrated in FIG. 5B, each of the terminals 61 is an approximately lateral V-shaped or inverted V-shaped member when viewed from side (X-Z plane).

A rear end (negative end along the X) of the main body 62 is embedded into and held by each of the terminal holding walls 15. Around a tip of the upper arm 63*a*, an upper contact part 64*a* curved and projected upward is formed. The upper contact part 64*a* projects upward above an upper surface of the module housing 12, and comes into contact with one of flat target terminals arranged on the second substrate 201 arranged above the connector 1. Around a tip of the lower arm 63*b*, a lower contact part 64*b* curved and projected downward is formed. The lower contact part 64*b* projects downward below a lower surface of the module housing 12, and comes into contact with one of flat target terminals arranged on the first substrate 101 arranged below the connector 1. The upper contact part 64*a* and the lower contact part 64*b* will be generally referred to as the contact parts 64. A portion of the main body 62 is exposed from each of the terminal holding walls 15 of one of the modules 11, and is to be accommodated in one of the terminal accommodation recesses 15*c* formed on the module housing 12 of another adjacent one of the modules 11. The other adjacent one of the modules 11 lies in front (positive side along the X axis).

As illustrated in FIG. 5B, on each of the terminals 61, a tip of the main body 62 is held by the module housing 12, and is positioned behind a line connecting the pair of contact parts 64 (negative direction along the X axis). When the terminal 61 comes into contact with one of the target terminals, and the pair of contact parts 64 receives a force in a direction (upper-lower direction) of approach of the pair of contact parts 64 each other, a rearward force acts onto the module housing 12 via the pair of contact arms 63. Similarly, when the terminal 61 comes into contact with the one of the target terminals, and the pair of contact parts 64 is displaced in the direction of approach of the pair of contact parts 64 each other, the module housing 12 is displaced rearward.

Each of the terminal holding walls 15 is formed with an upper arm through recess 15*a* and a lower arm through recess 15*b*. The upper arm through recess 15*a* is recessed downward from an upper end (positive end along the Z axis) of the terminal holding wall 15 to form a groove recess passing through the terminal holding wall 15 in the X-axis direction. The upper arm through recess 15*a* is formed at a position identical to a position of the upper arm 63*a* with respect to the Y-axis direction. The lower arm through recess 15*b* is recessed upward from a lower end (negative end along the Z axis) of the terminal holding wall 15 to form a groove recess passing through the terminal holding wall 15 in the X-axis direction. The lower arm through recess 15*b* is formed at a position identical to a position of the lower arm 63*b* with respect to the Y-axis direction. The upper arm through recess 15*a* and the lower arm through recess 15*b* of one of the modules 11 allow one of or two or more of the upper arms 63*a* and one of or two or more of the lower arms 63*b* of the terminals 61 of other adjacent columns of the modules 11 to pass through. The other adjacent columns of the modules 11 lie behind (negative side along the X axis). In the example illustrated in the drawings, the upper arm through recess 15*a* and the lower arm through recess 15*b* of one of the modules 11 allow two of the upper arms 63*a* and two of the lower arms 63*b* of two adjacent columns of the modules 11 to pass through. The two adjacent columns of the modules 11 lie behind.

The abutting blocks 14 of one of the modules 11 respectively abut the abutting blocks 14 of other adjacent ones of the modules 11. The other adjacent ones of the modules 11 lie in front and behind (positive side along the X axis and negative side along the X axis) the one of the modules 11. A front face 14*a* (positive side face along the X axis) of each of the abutting blocks 14 has front vertical faces 17*a* extending in the upper-lower direction (Z-axis direction) and front inclined faces 18*a* inclined with respect to the Z-axis direction. A rear face 14*b* (negative side face along the X axis) has rear vertical faces 17*b* extending in the Z-axis direction and rear inclined faces 18*b* inclined with respect to the Z-axis direction. As illustrated in FIG. 5B, the front vertical faces 17*a* and the rear vertical faces 17*b*, as well as the front inclined faces 18*a* and the rear inclined faces 18*b* are respectively parallel to each other. An arrangement of the front vertical faces 17*a* and the front inclined faces 18*a* on the front face 14*a* is identical to an arrangement of the rear vertical faces 17*b* and the rear inclined faces 18*b* on the rear face 14*b*. The front face 14*a* and the rear face 14*b* are wholly parallel to each other.

The front vertical faces 17*a* of one of the modules 11 face or abut the rear vertical faces 17*b* of the abutting blocks 14 of another adjacent one of the modules 11. The other adjacent one of the modules 11 lies in front of the one of the modules 11. The front inclined faces 18*a* of the one of the modules 11 abut the rear inclined faces 18*b* of the abutting blocks 14 of the other adjacent one of the modules 11. The other adjacent one of the modules 11 lies in front of the one of the modules 11. The rear vertical faces 17*b* of the one of the modules 11 face or abut the front vertical faces 17*a* of the abutting blocks 14 of another adjacent one of the modules 11. The other adjacent one of the modules 11 lies behind the one of the modules 11. The rear inclined faces 18*b* of the one of the modules 11 abut the front inclined faces 18*a* of the abutting blocks 14 of the other adjacent one of the modules 11. The other adjacent one of the modules 11 lies behind the one of the modules 11. The front vertical faces 17*a* and the rear vertical faces 17_b_ will be generally referred to as the vertical faces 17. The front inclined faces 18_a_ and the rear inclined faces 18_b_ will be generally referred to as the inclined faces 18.

In the example illustrated in the drawings, a number of the inclined faces 18 included in each of the front face 14_a_ and the rear face 14_b_ is two, respectively. In other words, the vertical face 17, the inclined face 18, the vertical face 17, the inclined face 18, and the vertical face 17 are arranged in this descending order. A size, in the Z-axis direction, of one of the vertical faces 17 lying between the two inclined faces 18 is smaller than a size of each of other ones of the vertical faces 17 lying on top and bottom ends. The sizes, in the Z-axis direction, of the vertical faces 17 lying on top and bottom ends are identical to each other. Sizes, in the Z-axis direction, of the two inclined faces 18 are also identical to each other. In the example illustrated in the drawings, the inclined faces 18 are inclined with respect to the negative direction along the X axis as the inclined faces 18 extend in the negative direction along the Z axis. However, the inclined faces 18 may be inclined with respect to the positive direction along the X axis as the inclined faces 18 extend in the negative direction along the Z axis.

Each of the coupling blocks 13 is formed with a coupling member accommodation recess 25_a_ and a positioning hole 25_b_. The coupling member accommodation recess 25_a_ is recessed upward from a lower end (negative end along the Z axis) of the coupling block 13 to form a slit recess passing through the coupling block 13 in the X-axis direction. The coupling member accommodation recess 25_a_ accommodates the main body 72 of the coupling member 71. The positioning hole 25_b_ is a slit through hole extending from an upper end (positive end along the Z axis) of the coupling block 13 to an upper end (not shown) of the coupling member accommodation recess 25_a_. The positioning hole 25_b_ is inserted with and accommodates one of the projecting pieces 73 of the coupling member 71 when the main body 72 is accommodated in the coupling member accommodation recess 25_a_. A size, in the X-axis direction, of the positioning hole 25_b_ is greater than a size, in the X-axis direction, of each of the projecting pieces 73. Even when the coupling members 71 are respectively attached to the coupling blocks 13, and the corresponding projecting pieces 73 are respectively accommodated in the positioning holes 25_b_, the modules 11 can be respectively displaced in the X-axis direction within a predetermined range relative to the coupling members 71.

The front housing part 21_a_ is also formed with the coupling member accommodation recesses 25_a_ and the positioning holes 25_b_. A plurality of the positioning holes 25_b_ are formed on the front housing part 21_a_ (in the example illustrated in the drawings, three).

The front housing part 21_a_ is formed with terminal arm accommodation recesses 23 at positions corresponding to the upper arm through recesses 15_a_ and the lower arm through recesses 15_b_ of another adjacent one of the modules 11. The other adjacent one of the modules 11 lies behind. Each of the terminal arm accommodation recesses 23 is recessed downward and upward from an upper end (positive end along the Z axis) and a lower end (negative end along the Z axis) of the front housing part 21_a_ to form a groove recess extending forward from a rear end (negative end along the X) of the front housing part 21_a_. Each of the terminal arm accommodation recesses 23 accepts and accommodates two to three of the upper arms 63_a_ and two to three of the lower arms 63_b_ of the terminals 61 of two to three adjacent columns of the modules 11. The two to three adjacent columns of the modules 11 lie behind the front housing part 21_a_.

The front housing part 21_a_ is further formed with one of coupling and positioning recesses 22. The coupling and positioning recesses 22 are groove recesses. The one of the coupling and positioning recesses 22 extends rearward from the front end (positive end along the X axis) of the front housing part 21_a_, and passes through from the upper end to the lower end of the front housing part 21_a_. When the connector 1 couples the first substrate 101 and the second substrate 201, coupling and positioning rods 191, described later, enter into the coupling and positioning recesses 22 for engagement. The connector 1 is thus positioned with respect to the first substrate 101 and/or the second substrate 201.

Similar to the rear faces 14_b_ of the modules 11, it is desirable that the rear vertical faces 17_b_ and the rear inclined faces 18_b_ be formed on the front housing part 21_a_ at positions corresponding to the front faces 14_a_ of another adjacent one of the modules 11. The other adjacent one of the modules 11 lies behind.

The rear housing part 21_b_ is also formed with the coupling member accommodation recesses 25_a_ and the positioning holes 25_b_. A plurality of the positioning holes 25_b_ are formed on the rear housing part 21_b_ (in the example illustrated in the drawings, three).

The rear housing part 21_b_ is also formed with another one of the coupling and positioning recesses 22. The coupling and positioning recesses 22 are the groove recesses. The other one of the coupling and positioning recesses 22 extends forward from a rear end (negative end along the X) of the rear housing part 21_b_, and pass through from an upper end to a lower end of the rear housing part 21_b_. When the connector 1 couples the first substrate 101 and the second substrate 201, coupling and positioning rods 191, described later, enter into the coupling and positioning recesses 22 for engagement. The connector 1 is thus positioned with respect to the first substrate 101 and/or the second substrate 201.

The rear housing part 21_b_ is not formed with the terminal arm accommodation recesses 23. Similar to the front faces 14_a_ of the modules 11, it is desirable that the front vertical faces 17_a_ and the front inclined faces 18_a_ be also formed on the rear housing part 21_b_ at positions corresponding to the rear faces 14_b_ of another adjacent one of the modules 11. The other adjacent one of the modules 11 lies in front of the one of the modules 11. The front housing part 21_a_ and the rear housing part 21_b_ will be generally referred to as the housing parts 21.

Next, direction conversion mechanisms included in the connector 1 will now be described.

Figure 6:
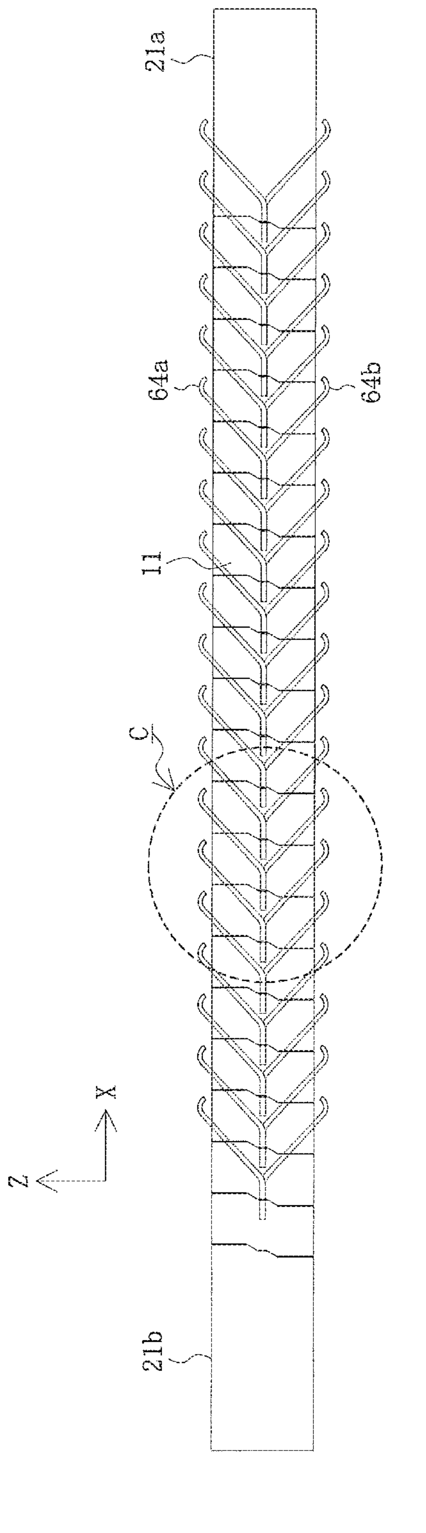
FIG. 6 is a cross-sectional view of the connector according to the first embodiment, taken along line A-A indicated by arrows in FIG. 2A.
Figure 7:
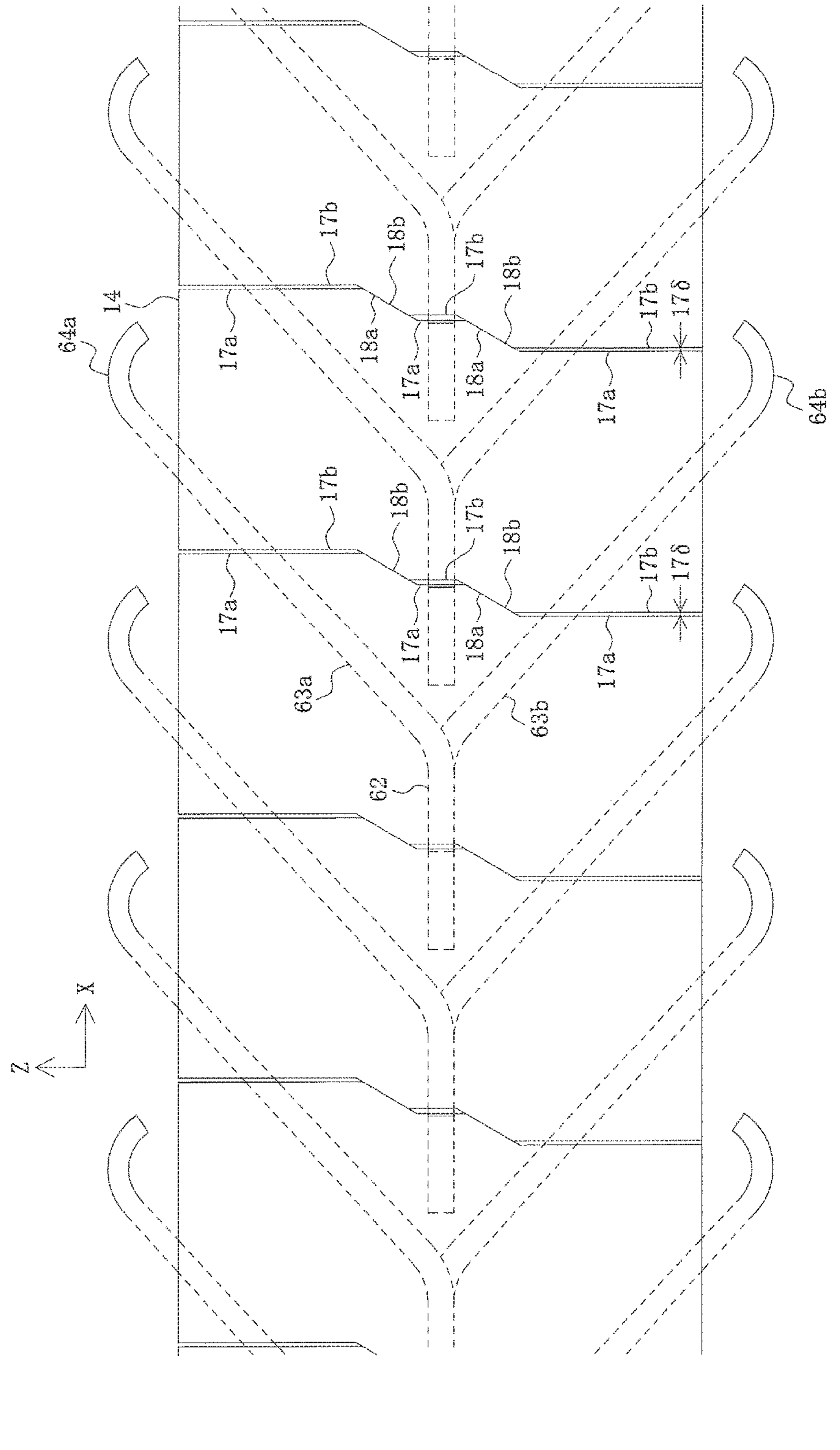
FIG. 7 is a partially enlarged cross-sectional view of the connector according to the first embodiment, and is an enlarged view of part C in FIG. 6.

FIG. 6 is a cross-sectional view of the connector according to the first embodiment, taken along line A-A indicated by the arrows in FIG. 2A. FIG. 7 is a partially enlarged cross-sectional view of the connector according to the first embodiment, and is an enlarged view of part C in FIG. 6.

In FIGS. 6 and 7, note that hatching is omitted on the cross sections for rendering purpose, and the terminals 61 are illustrated in a transparent manner for ease of understanding of the terminals 61.

As described above, on each of the terminals 61, the main body 62 is held by the module housing 12, and is positioned behind the line connecting the pair of contact parts 64. At least some of displacement in a direction of approach of the pair of contact parts 64 each other is converted into rearward displacement with respect to the main body 62. Similarly, at least some of a force received by the pair of contact parts 64 in a direction of approach of the pair of contact parts 64 each other is converted into a rearward force with respect to the main body 62. In other words, each of the terminals 61 includes a first direction conversion mechanism configured to convert at least some of displacement and a force received by the pair of contact parts 64 in the upper-lower direction (Z-axis direction) into displacement and a force in the longitudinal direction (X-axis direction) of the main body 62 and the module housing 12.

Each of the abutting blocks 14 of the module housings 12 includes a second direction conversion mechanism configured to convert at least some of displacement and a force in the longitudinal direction (X-axis direction) into displacement and a force in the upper-lower direction (Z-axis direction). The second direction conversion mechanism will now be described in detail.

As illustrated in the drawings, at an initial state of the connector 1, i.e., when the connector 1 is neither used to couple the first substrate 101 and the second substrate 201, nor applied with an external force onto the terminals 61, for example, the abutting blocks 14 of the module housings 12 adjacent to each other in the longitudinal direction, i.e., a front-rear direction (X-axis direction), abut to each other. However, when viewed in detail, although the inclined faces 18 abut to each other, the vertical faces 17 do not abut to each other, but are slightly away from each other.

In other words, as illustrated in FIG. 7, the front inclined faces 18*a* of the abutting blocks 14 of one of the module housings 12 abut the rear inclined faces 18*b* of the abutting blocks 14 of another adjacent one of the module housings 12. The other adjacent one of the module housings 12 lies in front (positive side along the X axis). Meanwhile the front vertical faces 17*a* of the abutting blocks 14 of the one of the module housings 12 do not abut, but simply face the rear vertical faces 17*b* of the abutting blocks 14 of the other adjacent one of the module housings 12. The other adjacent one of the module housings 12 lies in front. Gaps 176 are each present between each of the front vertical faces 17*a* and each of the rear vertical faces 17*b* of the two abutting blocks 14. Similarly, the rear inclined faces 18*b* of the abutting blocks 14 of the one of the module housings 12 abut the front inclined faces 18*a* of the abutting blocks 14 of another adjacent one of the module housings 12. The other adjacent one of the module housings 12 lies behind (negative side along the X axis). Meanwhile the rear vertical faces 17*b* of the abutting blocks 14 of the one of the module housings 12 do not abut, but simply face the front vertical faces 17*a* of the abutting blocks 14 of the other adjacent one of the module housings 12. The other adjacent one of the module housings 12 lies behind. Gaps 176 are each present between each of the rear vertical faces 17*b* and each of the front vertical faces 17*a* of the two abutting blocks 14.

When the connector 1 in the initial state, as described above, is used to couple the first substrate 101 and the second substrate 201, the upper contact parts 64*a* projecting upward above the upper surfaces of the module housings 12 are pushed downward by the target terminals of the second substrate 201. The lower contact parts 64*b* projecting downward below the lower surfaces of the module housings 12 are pushed upward by the target terminals of the first substrate 101. A force is received, and displacement is caused to occur in a direction of approach of each of the upper contact parts 64*a* and each of the lower contact parts 64*b* each other. The main bodies 62 and the module housings 12 holding the main bodies 62 receive the force, and thereby rearward displacement is caused to occur (negative direction along the X axis).

When the one of the module housings 12 receives a force, and when rearward displacement is caused to occur, the rear inclined faces 18*b* of the abutting blocks 14 abutting the front inclined faces 18*a* of the abutting blocks 14 of the other adjacent one of the module housings 12, the other adjacent one of the module housings 12 lying behind, can slide along the front inclined faces 18*a*. As a result, at least some of the rearward displacement and the rearward force in the longitudinal direction is converted into downward displacement and a downward force in the upper-lower direction. As illustrated in FIGS. 6 and 7, when the inclined faces 18 are respectively not inclined with respect to the negative direction along the X axis as the inclined faces 18 extend in the negative direction along the Z axis, but are inclined with respect to the positive direction along the X axis as the inclined faces 18 extend in the negative direction along the Z axis, at least some of rearward displacement and a rearward force in the longitudinal direction is converted into upward displacement and an upward force in the upper-lower direction. A ratio of conversion of displacement and a force in the longitudinal direction into displacement and a force in the upper-lower direction varies in accordance with an angle of inclination of each of the inclined faces 18. When the one of the module housings 12 is displaced rearward, and the gaps 176 or greater gaps are created, displacement and a force in the longitudinal direction are not converted into displacement and a force in the upper-lower direction.

In the example illustrated in the drawings, a number of the terminals 61 in each of the modules 11 is five, while a number of the modules 11 arranged in the longitudinal direction is 20. Even when an amount of rearward displacement and a rearward force in the longitudinal direction converted by each of the terminals 61 is negligibly small, the amount can successively accumulate, and becomes significantly greater at a module 11 located at the end of the line of the modules 11. On the other hand, the connector 1 according to the present embodiment converts, in the modules 11, at least some of rearward displacement and a rearward force in the longitudinal direction into displacement and a force in the upper-lower direction. Thus, even when a many number of the modules 11 are arranged in the longitudinal direction, displacement and a force in the longitudinal direction would be less likely to accumulate and increase.

Rearward displacement in the longitudinal direction from the modules 11 can be suppressed in amount to a certain degree (20 times of each of the gaps 17δ even at a module 11 located foremost of the line of the modules 11). Thus, when the target terminals cause displacement in a direction of approach of each of the upper contact parts 64*a* and each of the lower contact parts 64*b* each other, each of the upper contact parts 64*a* and each of the lower contact parts 64*b* are displaced forward relative to the target terminals. The target terminals and the terminals can rub with each other, achieving a wiping effect.

Next, how to electrically couple the first substrate 101 and the second substrate 201 with the connector 1 configured as described above will now be described.

Figure 8:
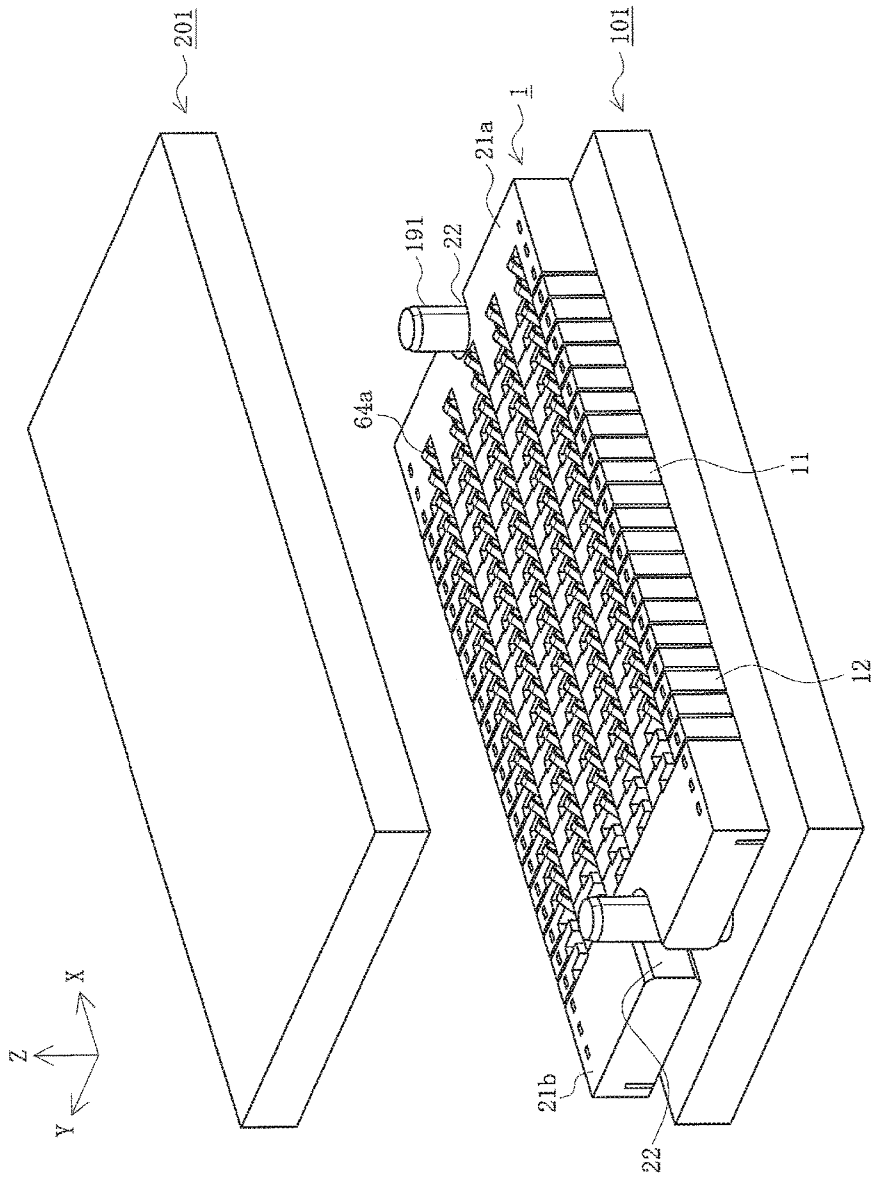
FIG. 8 is a perspective view illustrating how substrates are coupled with the connector according to the first embodiment.
Figure 9A:
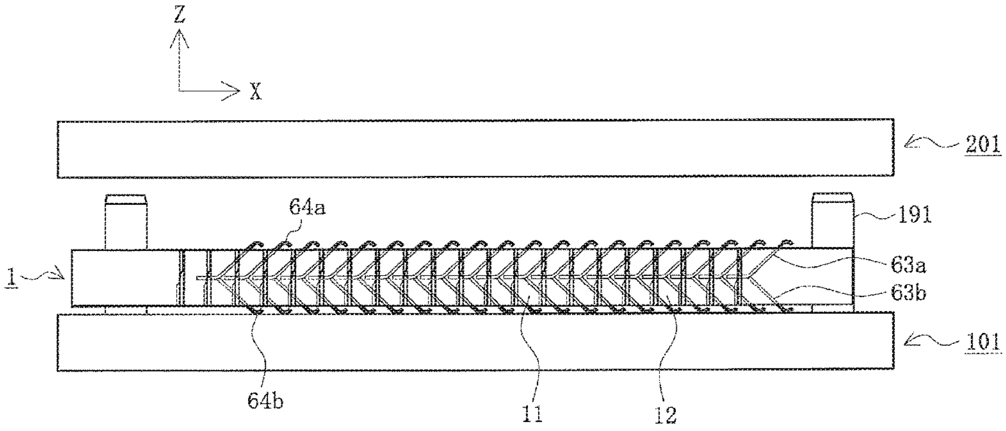
FIGS. 9A and 9B are side views illustrating how the substrates are coupled with the connector according to the first embodiment, where
Figure 9B:
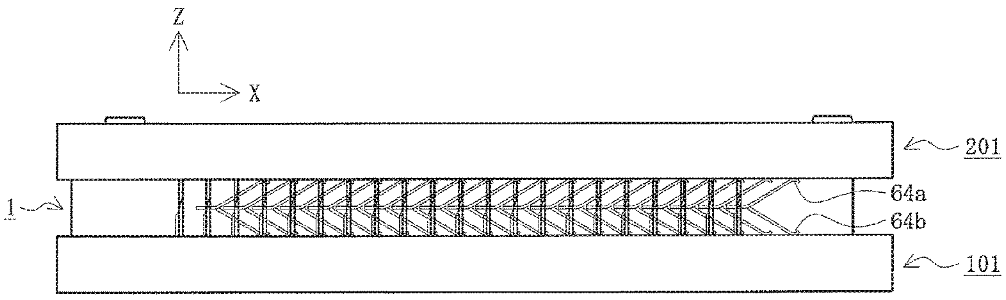

FIG. 8 is a perspective view illustrating how substrates are coupled with the connector according to the first embodiment. FIGS. 9A and 9B are side views illustrating how the substrates are coupled with the connector according to the first embodiment. FIG. 9A is a view before fully coupled, while FIG. 9B is a view after fully coupled.

In FIGS. 9A and 9B, note that the terminals 61 are illustrated in a transparent manner for ease of understanding of the terminals 61.

The first substrate 101 and the second substrate 201 may be, but not limited to, any kinds of substrates for any purposes. Although not shown in the drawings, an upper surface of the first substrate 101, i.e., positive side face along the Z axis, is arranged with the plurality of flat target terminals, while a lower surface of the second substrate 201, i.e., negative side face along the Z axis, is also arranged with the plurality of flat target terminals. A number and an arrangement of the target terminal on the first substrate 101 are identical to a number and an arrangement of the lower contact parts 64*b* of the terminals 61. The lower contact parts 64*b* project downward below the lower surfaces of the module housings 12. A number and an arrangement of the target terminals on the second substrate 201 are identical to a number and an arrangement of the upper contact parts 64*a* of the terminals 61. The upper contact parts 64*a* project upward above the upper surfaces of the module housings 12. The first substrate 101 is attached with the pair of circular-column-shaped coupling and positioning rods 191 extending upward (positive direction along the Z axis). The second substrate 201 is formed with coupling and positioning rod accommodation holes (not shown). The coupling and positioning rod accommodation holes accommodate upper ends of the coupling and positioning rods 191.

As illustrated in FIG. 8 and FIG. 9A, the connector 1 is first placed on the upper surface of the first substrate 101. At this time, the coupling and positioning rods 191 enter into the coupling and positioning recesses 22 respectively formed on the front housing part 21*a* and the rear housing part 21*b* for engagement. The connector 1 is positioned onto the first substrate 101. The lower contact parts 64*b* projecting downward below the lower surfaces of the module housings 12 come into contact with the corresponding target terminals on the first substrate 101.

The second substrate 201 is then placed on an upper surface of the connector 1. At this time, the upper ends of the coupling and positioning rods 191 enter into the coupling and positioning rod accommodation holes on the second substrate 201 for engagement. The second substrate 201 is positioned onto the first substrate 101 and the connector 1. The upper contact parts 64*a* projecting upward above the upper surfaces of the module housings 12 come into contact with the corresponding target terminals on the second substrate 201.

The second substrate 201 is pushed toward the first substrate 101, i.e., downward. As illustrated in FIG. 9B, the connector 1 fully couples the first substrate 101 and the second substrate 201. The target terminals on the first substrate 101 and the corresponding target terminals on the second substrate 201 are allowed to conduct to each other via the corresponding terminals 61. At this time, the lower contact parts 64*b* projecting downward below the lower surfaces of the module housings 12 are pushed upward by the target terminals on the first substrate 101, while the upper contact parts 64*a* projecting upward above the upper surfaces of the module housings 12 are pushed downward by the target terminals on the second substrate 201.

As described above, in the present embodiment, the connector 1 includes the plurality of module housings 12 extending in the lateral direction and arranged in the longitudinal direction orthogonal to the lateral direction, and the terminals 61 attached to the module housings 12. The terminals 61 each include the pair of contact parts 64 respectively projecting upward above the upper surface and downward below the lower surface of each of the module housings 12, and the first direction conversion mechanism configured to convert at least some of displacement and a force received by the pair of contact parts 64 in the upper-lower direction orthogonal to the longitudinal direction and the lateral direction into displacement and a force in the longitudinal direction. The module housings 12 each include the second direction conversion mechanism configured to convert at least some of displacement and a force received from each of the terminals 61 in the longitudinal direction into displacement and a force in the upper-lower direction.

Accordingly, even when a many number of the module housings 12 are used, displacement and a force received from the terminals 61 in the longitudinal direction can be prevented from accumulating and increasing. The contact parts 64 and the target terminals would be less likely to be displaced, allowing to achieve a wiping effect. Thus, the terminals 61 and the target terminals can be securely coupled with a simple but reliable, cost effective structure.

The terminals 61 each include the main body 62 held by each of the module housings 12, and the pair of contact arms 63 respectively extending upward and downward from the main body 62. The contact parts 64 are respectively formed adjacent to the tips of the contact arms 63. The contact parts 64 are respectively positioned in front of the main body 62 in the longitudinal direction. The first direction conversion mechanism includes the main body 62, the pair of contact arms 63, and the pair of contact parts 64. When the connector 1 is used to couple the first substrate 101 and the second substrate 201, the pairs of contact parts 64 receive a force, and move closer to each other. Displacement is accordingly caused to occur. At least some of the displacement and the force received by the pairs of contact parts 64 in a direction of approach of each of the pairs of contact parts 64 each other in the upper-lower direction is converted into rearward displacement and a rearward force with respect to the module housings 12.

The module housings 12 each include the abutting blocks 14. The abutting blocks 14 each have the front face 14*a* facing forward in the longitudinal direction and the rear face 14*b* facing rearward in the longitudinal direction. The front face 14*a* and the rear face 14*b* respectively include the front inclined faces 18*a* and the rear inclined faces 18*b* respectively inclined with respect to the upper-lower direction. The rear inclined faces 18*b* respectively abut the front inclined faces 18*a* of each of the abutting blocks 14 of another adjacent one of the module housings 12. The other adjacent one of the module housings 12 lies behind in the longitudinal direction. The second direction conversion mechanism includes each of the abutting blocks 14. When one of the module housings 12 receives a force, and when rearward displacement is caused to occur, the rear inclined faces 18*b* of the abutting blocks 14 abutting the front inclined faces 18*a* of the abutting blocks 14 of another adjacent one of the module housings 12, the other adjacent one of the module housings 12 lying behind, can slide along the front inclined faces 18*a*. As a result, at least some of the rearward displacement and the rearward force in the longitudinal direction is converted into displacement and a force in the upper-lower direction.

The front face 14*a* and the rear face 14*b* respectively have the front vertical faces 17*a* and the rear vertical faces 17*b* extending in the upper-lower direction. Before the second direction conversion mechanism converts at least some of displacement and a force in the longitudinal direction into displacement and a force in the upper-lower direction, the rear vertical faces 17*b* are respectively away from the front vertical faces 17*a* of each of the abutting blocks 14 of the other adjacent one of the module housings 12. The other adjacent one of the module housings 12 lies behind in the longitudinal direction. The rear inclined faces 18*b* of the abutting blocks 14 can slide along the front inclined faces 18*a* of the abutting blocks 14 of the other adjacent one of the module housings 12.

The plurality of front vertical faces 17*a* and the plurality of rear vertical faces 17*b* are arranged in the upper-lower direction. Each of the front inclined faces 18*a* and each of the rear inclined faces 18*b* are respectively arranged between the front vertical faces 17*a* adjacent to each other in the upper-lower direction and between the rear vertical faces 17*b* adjacent to each other in the upper-lower direction. The abutting blocks 14 and the module housings 12 can be stably held.

The module housings 12 each have the terminal holding walls 15 each configured to hold the main body 62. The terminal holding walls 15 each have the upper arm through recess 15*a* and the lower arm through recess 15*b*. The upper arm through recess 15*a* and the lower arm through recess 15*b* are grooves allowing one of or two or more of the pairs of contact arms 63 of the terminals 61 of other adjacent ones of the module housings 12 to pass through. The other adjacent ones of the module housings 12 lie behind in the longitudinal direction. Even when the contact arms 63 are respectively extended longer, or an angle of inclination of each of the contact arms 63 is changed and the contact arms 63 are moved closer with respect to the longitudinal direction, the contact arms 63 can be freely and greatly displaced in the upper-lower direction. As well as the contact arms 63 can each be accommodated between each of the upper surfaces and each of the lower surfaces of the module housings 12.

The plurality of terminal holding walls 15 are arranged in the lateral direction. Each of the abutting blocks 14 is arranged between the terminal holding walls 15 adjacent to each other in the lateral direction. Displacement and a force in the longitudinal direction converted by the first direction conversion mechanisms transmit to the second direction conversion mechanisms.

Further, the connector 1 includes the coupling members 71 each include the main body 72 extending in the longitudinal direction, and the plurality of projecting pieces 73 projecting from the main body 72 to form comb teeth. The module housings 12 each include the coupling blocks 13 each formed with the positioning hole 25*b* configured to accommodate one of the projecting pieces 73. A size, in the longitudinal direction, of the positioning hole 25*b* is greater than a size, in the longitudinal direction, of each of the projecting pieces 73. The plurality of module housings 12 can be positioned at a certain degree in the longitudinal direction, and can be slightly displaced.

The connector 1 further includes a pair of the front housing part 21*a* and the rear housing part 21*b*. The pair of the front housing part 21*a* and the rear housing part 21*b* are configured to be coupled to the coupling members 71. The plurality of module housings 12 are arranged between the front housing part 21*a* and the rear housing part 21*b*. The plurality of module housings 12 can be arranged in the longitudinal direction and securely coupled.

Next a second embodiment will be described. Note that the description of objects having the same structures as those of the first embodiment will be omitted by being denoted by the same reference numerals. Furthermore, the description of operations and effects that are the same as those of the first embodiment will be omitted.

Figure 10:
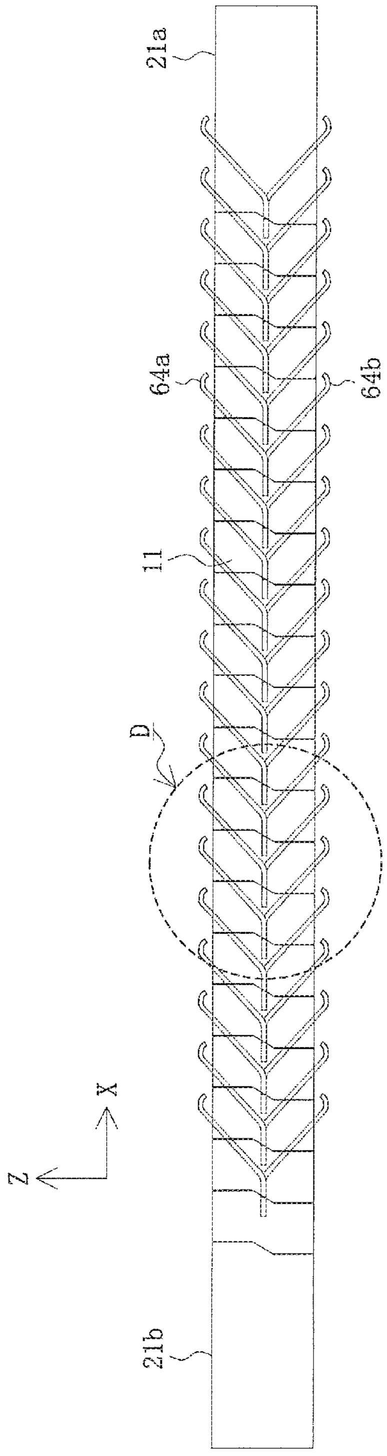
FIG. 10 is a cross-sectional view of a connector according to a second embodiment, and corresponds to the cross-sectional view taken along line A-A indicated by the arrows in FIG. 2A.
Figure 11:
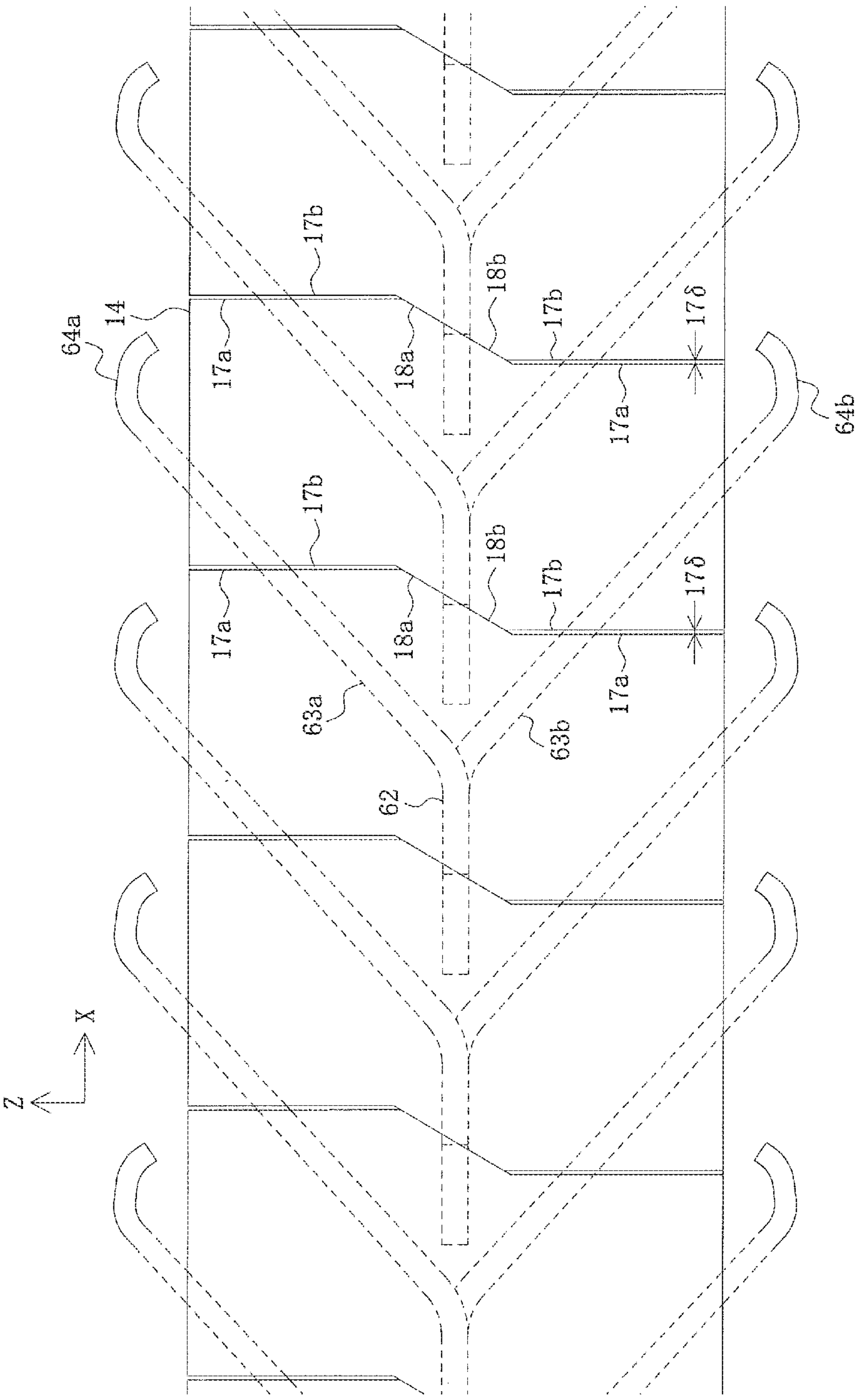
FIG. 11 is a partially enlarged cross-sectional view of the connector according to the second embodiment, and is an enlarged view of part D in FIG. 10.

FIG. 10 is a cross-sectional view of a connector according to a second embodiment, and corresponds to the cross-sectional view taken along A-A indicated by the arrows in FIG. 2A. FIG. 11 is a partially enlarged cross-sectional view of the connector according to the second embodiment, and is an enlarged view of part D in FIG. 10.

In FIGS. 10 and 11, note that hatching is omitted on the cross sections for rendering purpose, and the terminals 61 are illustrated in a transparent manner for ease of understanding of the terminals 61.

In the present embodiment, a number of the inclined faces 18 included in each of the front faces 14*a* and each of the rear faces 14*b* is only one. In other words, the vertical face 17, the inclined face 18, and the vertical face 17 are arranged in this descending order. The sizes, in the Z-axis direction, of the vertical faces 17 lying on top and bottom ends are identical to each other. In the example illustrated in the drawings, the inclined faces 18 are inclined with respect to the negative direction along the X axis as the inclined faces 18 extend in the negative direction along the Z axis. However, the inclined faces 18 may be inclined with respect to the positive direction along the X axis as the inclined faces 18 extend in the negative direction along the Z axis.

It should be noted that descriptions of configurations, operations, and effects of other aspects of the connector 1 according to the present embodiment are identical to the descriptions of the first embodiment, and are thus omitted. It should also be noted that a description of how to electrically couple the first substrate 101 and the second substrate 201 with the connector 1 according to the present embodiment is identical to the description of the first embodiment, and is thus omitted.

Next, a third embodiment will be described. It should be noted that the description of objects having the same structure as the first and second embodiments will be omitted by denoting said objects by the same symbols. Furthermore, descriptions of operations and effects that are the same as those of the first and second embodiments will also be omitted.

Figure 12:
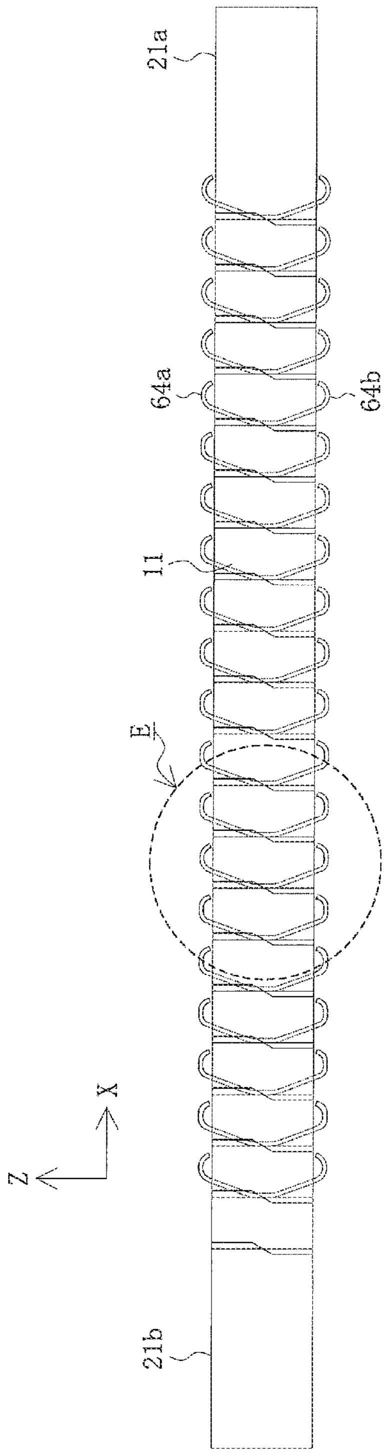
FIG. 12 is a cross-sectional view of a connector according to a third embodiment, and corresponds to the cross-sectional view taken along line A-A indicated by the arrows in FIG. 2A.
Figure 13:
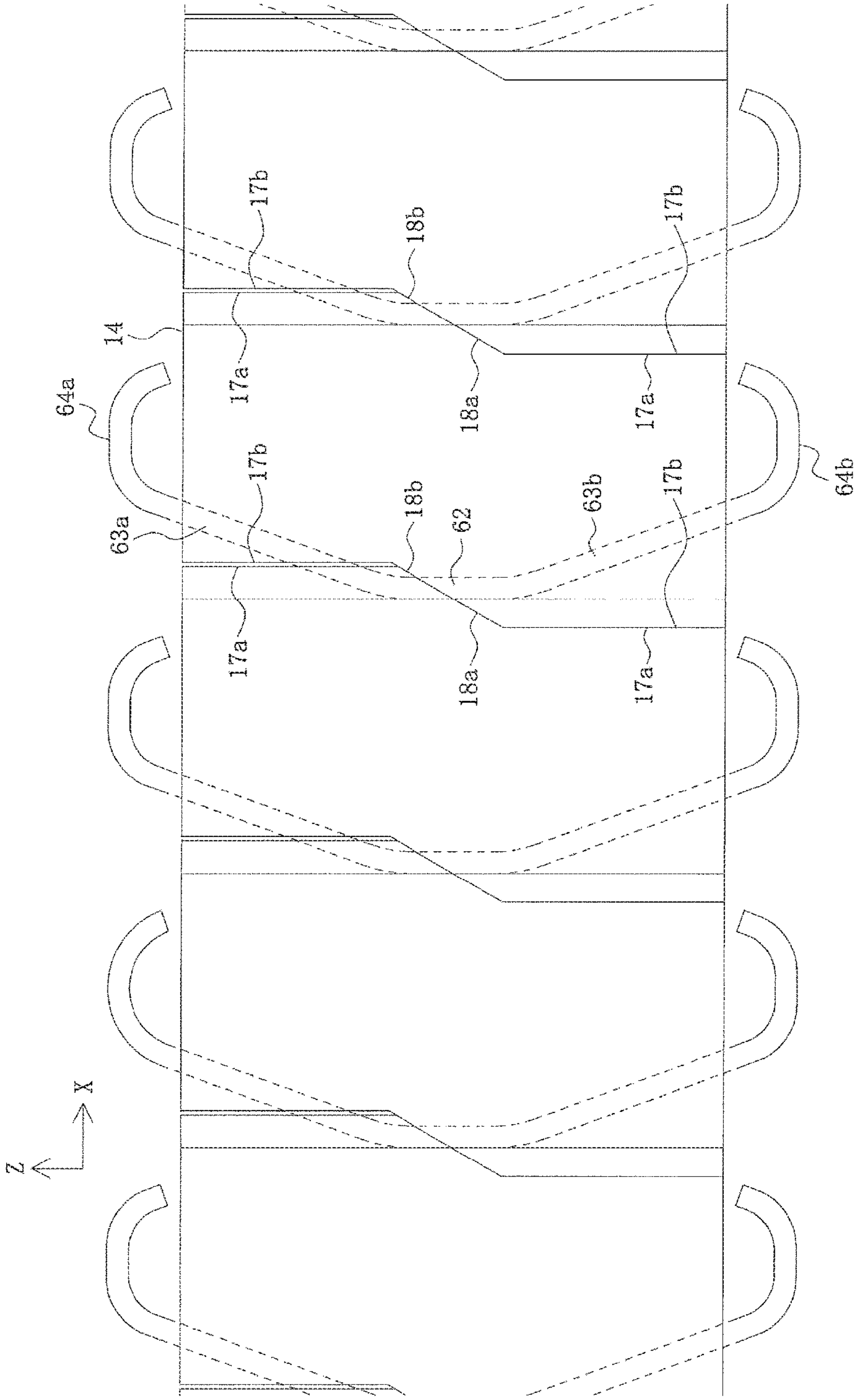
FIG. 13 is a partially enlarged cross-sectional view of the connector according to the third embodiment, and is an enlarged view of part E in FIG. 12.
Figure 14:
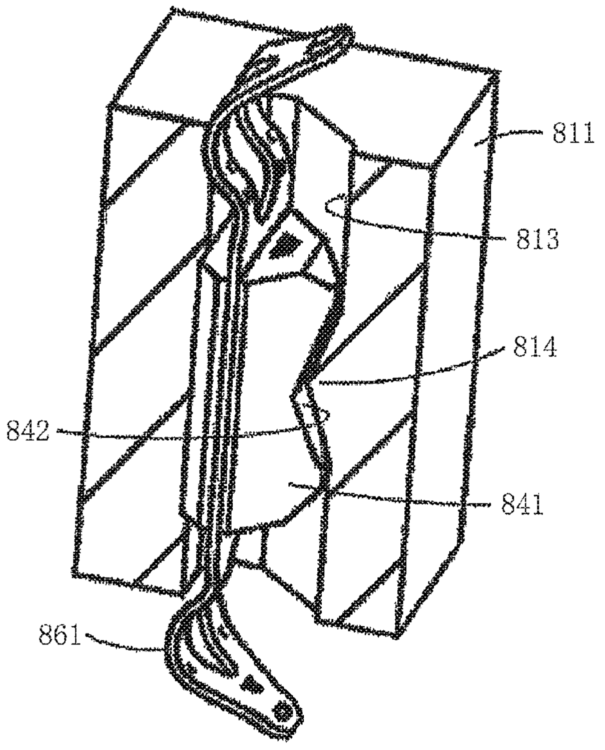
FIG. 14 Prior Art
FIG. 14 is a cross-sectional view of a terminal attaching part of a conventional connector.

FIG. 12 is a cross-sectional view of a connector according to a third embodiment, and corresponds to the cross-sectional view taken along line A-A indicated by the arrows in FIG. 2A. FIG. 13 is a partially enlarged cross-sectional view of the connector according to the third embodiment, and is an enlarged view of part E in FIG. 12.

In FIGS. 12 and 13, note that hatching is omitted on the cross sections for rendering purpose, and the terminals 61 are illustrated in a transparent manner for ease of understanding of the terminals 61.

In the present embodiment, the main bodies 62 of the terminals 61 extend in the Z-axis direction. Intermediate parts of the terminals 61 are respectively embedded and held by the module housings 12. Each of the upper arms 63*a* of the terminals 61 extends diagonally upward (positive direction along the X axis and positive direction along the Z axis) from an upper end (positive end along the Z axis) of each of the main bodies 62. Each of the lower arms 63*b* of the terminals 61 extends diagonally downward (positive direction along the X axis and negative direction along the Z axis) from a lower end (negative end along the Z axis) of each of the main bodies 62.

It should be noted that descriptions of configurations, operations, and effects of other aspects of the connector 1 according to the present embodiment are identical to the descriptions of the second embodiment, and are thus omitted. It should also be noted that a description of how to electrically couple the first substrate 101 and the second substrate 201 with the connector 1 according to the present embodiment is identical to the description of the second embodiment, and is thus omitted.

Note that the disclosure of the present specification describes characteristics related to preferred and exemplary embodiments. Various other embodiments, modifications and variations within the scope and spirit of the claims appended hereto could naturally be conceived by persons skilled in the art by summarizing the disclosures of the present specification.

The present disclosure can be applied to connectors.

The invention claimed is:

1. A connector comprising:

a plurality of identically configured module housings extending in a lateral direction and arranged in a longitudinal direction orthogonal to the lateral direction, wherein each module housing has first and second opposite lateral ends, wherein the first lateral ends of the plurality of module housings are planar and wherein the second lateral ends of the plurality of module housings are planar; and terminals attached to the module housings, wherein the terminals each include:

a pair of contact parts respectively projecting upward above an upper surface and downward below a lower surface of each of the module housings; and a first direction conversion mechanism configured to convert at least some of displacement and a force received by the pair of contact parts in an upper-lower direction orthogonal to the lateral direction and the longitudinal direction into displacement and a force in the longitudinal direction, and wherein the module housings each include a second direction conversion mechanism configured to convert at least some of displacement and a force received from each of the terminals in the longitudinal direction into displacement and a force in the upper-lower direction.

2. The connector according to claim 1, wherein the terminals each include:

a main body held by each of the module housings; and a pair of contact arms respectively extending upward and downward from the main body, wherein the contact parts are respectively formed adjacent to tips of the contact arms, and are respectively positioned in front of the main body in the longitudinal direction, and wherein the first direction conversion mechanism includes the main body, the pair of contact arms, and the pair of contact parts.

3. A connector comprising:

a plurality of module housings extending in a lateral direction and arranged in a longitudinal direction orthogonal to the lateral direction; and terminals attached to the module housings, wherein the terminals each include:

a pair of contact parts respectively projecting upward above an upper surface and downward below a lower surface of each of the module housings; and a first direction conversion mechanism configured to convert at least some of displacement and a force received by the pair of contact parts in an upper-lower direction orthogonal to the lateral direction and the longitudinal direction into displacement and a force in the longitudinal direction, wherein the module housings each include a second direction conversion mechanism configured to convert at least some of displacement and a force received from each of the terminals in the longitudinal direction into displacement and a force in the upper-lower direction, wherein the module housings each include abutting blocks, wherein the abutting blocks each have a front face facing forward in the longitudinal direction and a rear face facing rearward in the longitudinal direction, wherein the front face and the rear face respectively have front inclined faces and rear inclined faces respectively inclined with respect to the upper-lower direction, wherein the rear inclined faces respectively abut the front inclined faces of each of the abutting blocks of another adjacent one of the module housings, the other adjacent one of the module housings lying behind in the longitudinal direction, and wherein the second direction conversion mechanism includes each of the abutting blocks.

4. The connector according to claim 3, wherein the front face and the rear face respectively have front vertical faces and rear vertical faces extending in the upper-lower direction, and wherein, before the second direction conversion mechanism converts at least some of displacement and a force in the longitudinal direction into displacement and a force in the upper-lower direction, the rear vertical faces are respectively away from the front vertical faces of each of the abutting blocks of the other adjacent one of the module housings, the other adjacent one of the module housings lying behind in the longitudinal direction.

5. The connector according to claim 4, wherein the plurality of front vertical faces and the plurality of rear vertical faces are arranged in the upper-lower direction, and wherein each of the front inclined faces and each of the rear inclined faces are respectively arranged between the front vertical faces adjacent to each other in the upper-lower direction and between the rear vertical faces adjacent to each other in the upper-lower direction.

6. A connector comprising:

a plurality of module housings extending in a lateral direction and arranged in a longitudinal direction orthogonal to the lateral direction; and terminals attached to the module housings, wherein the terminals each include:

a pair of contact parts respectively projecting upward above an upper surface and downward below a lower surface of each of the module housings; and a first direction conversion mechanism configured to convert at least some of displacement and a force received by the pair of contact parts in an upper-lower direction orthogonal to the lateral direction and the longitudinal direction into displacement and a force in the longitudinal direction, wherein the module housings each include a second direction conversion mechanism configured to convert at least some of displacement and a force received from each of the terminals in the longitudinal direction into displacement and a force in the upper-lower direction, wherein the terminals each include:

a main body held by each of the module housings; and a pair of contact arms respectively extending upward and downward from the main body, wherein the contact parts are respectively formed adjacent to tips of the contact arms, and are respectively positioned in front of the main body in the longitudinal direction, wherein the first direction conversion mechanism includes the main body, the pair of contact arms, and the pair of contact parts, wherein the module housings each have terminal holding walls each configured to hold the main body, and wherein the terminal holding walls each have groove recesses allowing one of or two or more of the pairs of contact arms of the terminals of other adjacent ones of the module housings, the other adjacent ones of the module housings lying behind in the longitudinal direction, to pass through.

7. The connector according to claim 6, wherein the plurality of terminal holding walls are arranged in the lateral direction, and wherein each of the abutting blocks is arranged between the terminal holding walls adjacent to each other in the lateral direction.

8. A connector comprising:

a plurality of module housings extending in a lateral direction and arranged in a longitudinal direction orthogonal to the lateral direction; and terminals attached to the module housings, wherein the terminals each include:

a pair of contact parts respectively projecting upward above an upper surface and downward below a lower surface of each of the module housings; and a first direction conversion mechanism configured to convert at least some of displacement and a force received by the pair of contact parts in an upper-lower direction orthogonal to the lateral direction and the longitudinal direction into displacement and a force in the longitudinal direction, wherein the module housings each include a second direction conversion mechanism configured to convert at least some of displacement and a force received from each of the terminals in the longitudinal direction into displacement and a force in the upper-lower direction, the connector further comprising coupling members each including:

a main body extending in the longitudinal direction; and a plurality of projecting pieces projecting from the main body to form comb teeth, wherein the module housings each include coupling blocks each formed with a positioning hole configured to accommodate one of the projecting pieces, and wherein a size, in the longitudinal direction, of the positioning hole is greater than a size, in the longitudinal direction, of each of the projecting pieces.

9. The connector according to claim 8, further comprising a pair of housing parts configured to be coupled to the coupling members, wherein the plurality of module housings are arranged between the housing parts.

10. A connector comprising:

a plurality of identically configured module housings extending in a lateral direction and arranged in a longitudinal direction orthogonal to the lateral direction; and terminals attached to the module housings, wherein the terminals each include:

a pair of contact parts respectively projecting upward above an upper surface and downward below a lower surface of each of the module housings; and a first direction conversion mechanism configured to convert at least some of displacement and a force received by the pair of contact parts in an upper-lower direction orthogonal to the lateral direction and the longitudinal direction into displacement and a force in the longitudinal direction, and wherein the module housings each include a second direction conversion mechanism configured to convert at least some of displacement and a force received from each of the terminals in the longitudinal direction into displacement and a force in the upper-lower direction, wherein the terminals of each module housing are in alignment with the terminals of an adjacent module housing.

* * * * *